US008669890B2

(12) United States Patent
Wang et al.

(10) Patent No.: US 8,669,890 B2
(45) Date of Patent: Mar. 11, 2014

(54) METHOD AND APPARATUS OF ESTIMATING/CALIBRATING TDC MISMATCH

(75) Inventors: Chi-Hsueh Wang, Kaohsiung (TW); Robert Bogdan Staszewski, Delft (NL); Yi-Hsien Cho, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/610,827

(22) Filed: Sep. 11, 2012

(65) Prior Publication Data

US 2013/0187800 A1 Jul. 25, 2013

Related U.S. Application Data

(60) Provisional application No. 61/589,018, filed on Jan. 20, 2012.

(51) Int. Cl.
*H03M 1/06* (2006.01)

(52) U.S. Cl.
USPC ........... 341/118; 375/362; 375/365; 375/366; 375/376; 327/107; 327/158; 327/159; 327/166; 327/149

(58) Field of Classification Search
USPC .......... 341/118–155; 375/362, 365, 366, 376; 327/12, 107, 158, 3, 159, 166, 149, 327/150, 155
See application file for complete search history.

(56) References Cited

U.S. PATENT DOCUMENTS

| | | | | |
|---|---|---|---|---|
| 6,429,693 | B1 | 8/2002 | Staszewski | |
| 7,427,940 | B2 * | 9/2008 | Staszewski et al. | 341/155 |
| 7,482,956 | B2 * | 1/2009 | Huang et al. | 341/120 |
| 7,940,099 | B2 * | 5/2011 | Weltin-Wu et al. | 327/159 |
| 8,000,428 | B2 | 8/2011 | Staszewski | |
| 8,090,068 | B2 * | 1/2012 | Sun et al. | 375/376 |
| 8,198,929 | B2 * | 6/2012 | Pellerano et al. | 327/158 |
| 2011/0267120 | A1 * | 11/2011 | Ravi et al. | 327/159 |
| 2013/0002317 | A1 * | 1/2013 | Frantzeskakis et al. | 327/156 |

* cited by examiner

*Primary Examiner* — Lam T Mai
(74) *Attorney, Agent, or Firm* — Winston Hsu; Scott Margo

(57) ABSTRACT

A method of estimating mismatches of a time-to-digital converter (TDC) includes: capturing phase error samples; calculating difference between the phase error samples and an expected value of the phase error samples; and adjusting correction gain of the TDC based on the calculating step. Another method of estimating mismatches of a TDC includes: capturing TDC output code samples; storing a plurality of accumulation values corresponding to different TDC values respectively, wherein each accumulation value records a number of times a TDC value is carried by the TDC output code samples; calculating a desired value based on the accumulation values; calculating difference between the accumulation values and the desired value; and adjusting correction gain of the TDC based on the calculating step.

32 Claims, 8 Drawing Sheets

METHOD AND APPARATUS OF ESTIMATING/CALIBRATING TDC MISMATCH

CROSS REFERENCE TO RELATED APPLICATIONS

This application claims the benefit of U.S. provisional application No. 61/589,018, filed on Jan. 20, 2012 and incorporated herein by reference.

BACKGROUND

The disclosed embodiments of the present invention relate to a time-to-digital converter (TDC) which may be part of an all-digital phase-locked loop, and more particularly, to a method of estimating/calibrating the TDC mismatch and a related apparatus.

All-digital phase-locked loop (ADPLL) is a very attractive technique for a multi-radio system on chip (SOC). It results in the smaller occupied circuit area and lower power consumption, especially compared with the analog PLL circuit. For example, an ADPLL includes a digitally-controlled oscillator (DCO), a time-to-digital converter (TDC), and a digital loop filter. The TDC is an important circuit module used to measure timestamp, and the measurement result is a finite-length digital word. The TDC used in the ADPLL acts as a phase/frequency detector and a charge pump used in the analog PLL. Taking the advantage of the digital implementation, the TDC is easily to be programmed and calibrated, which makes it very suitable for the ADPLL. Recently, due to development of the deep-submicron CMOS technology, the TDC may be implemented utilizing a simple inverter chain, with each inverter providing a stable delay. As the TDC is a key component of the ADPLL, the gain and linearity performance of the TDC significantly affects the quality of the ADPLL. There is a need for an innovative design which can calibrate the TDC gain and nonlinearity precisely without adding too many extra detection and compensation circuits.

SUMMARY

In accordance with exemplary embodiments of the present invention, a method of estimating/calibrating the TDC mismatch and a related apparatus are proposed to solve the above-mentioned problem.

According to a first aspect of the present invention, an exemplary method of estimating mismatches of a time-to-digital converter (TDC) includes: capturing phase error samples; calculating difference between the phase error samples and an expected value of the phase error samples; and adjusting correction gain of the TDC based on the calculating step.

According to a second aspect of the present invention, an exemplary method of estimating mismatches of a time-to-digital converter (TDC) includes: capturing TDC output code samples; generating a plurality of accumulation values corresponding to different TDC values respectively, wherein each accumulation value records a number of times a TDC value carried by the TDC output code samples; calculating a desired value based on the accumulation values; calculating difference between the accumulation values and the desired value; and adjusting correction gain of the TDC based on the calculating step.

According to a third aspect of the present invention, an exemplary apparatus of estimating mismatches of a time-to-digital converter (TDC) is provided. The exemplary apparatus includes a first capturing circuit and a first adjusting circuit. The first capturing circuit is arranged for capturing phase error samples. The first adjusting circuit is arranged for calculating difference between the phase error samples and an expected value of the phase error samples, and adjusting correction gain of the TDC based on the difference.

According to a fourth aspect of the present invention, an exemplary apparatus of estimating mismatches of a time-to-digital converter (TDC) is provided. The exemplary apparatus includes a capturing circuit, a calculating circuit and an adjusting circuit. The capturing circuit is arranged for capturing TDC output code samples, and storing a plurality of accumulation values corresponding to different TDC values respectively, wherein each accumulation value records a number of times a TDC value is carried by the TDC output code samples. The calculating circuit is arranged for calculating a desired value based on the accumulation values. The adjusting circuit is arranged for calculating difference between the accumulation values and the desired value, and adjusting correction gain of the TDC based on the difference.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
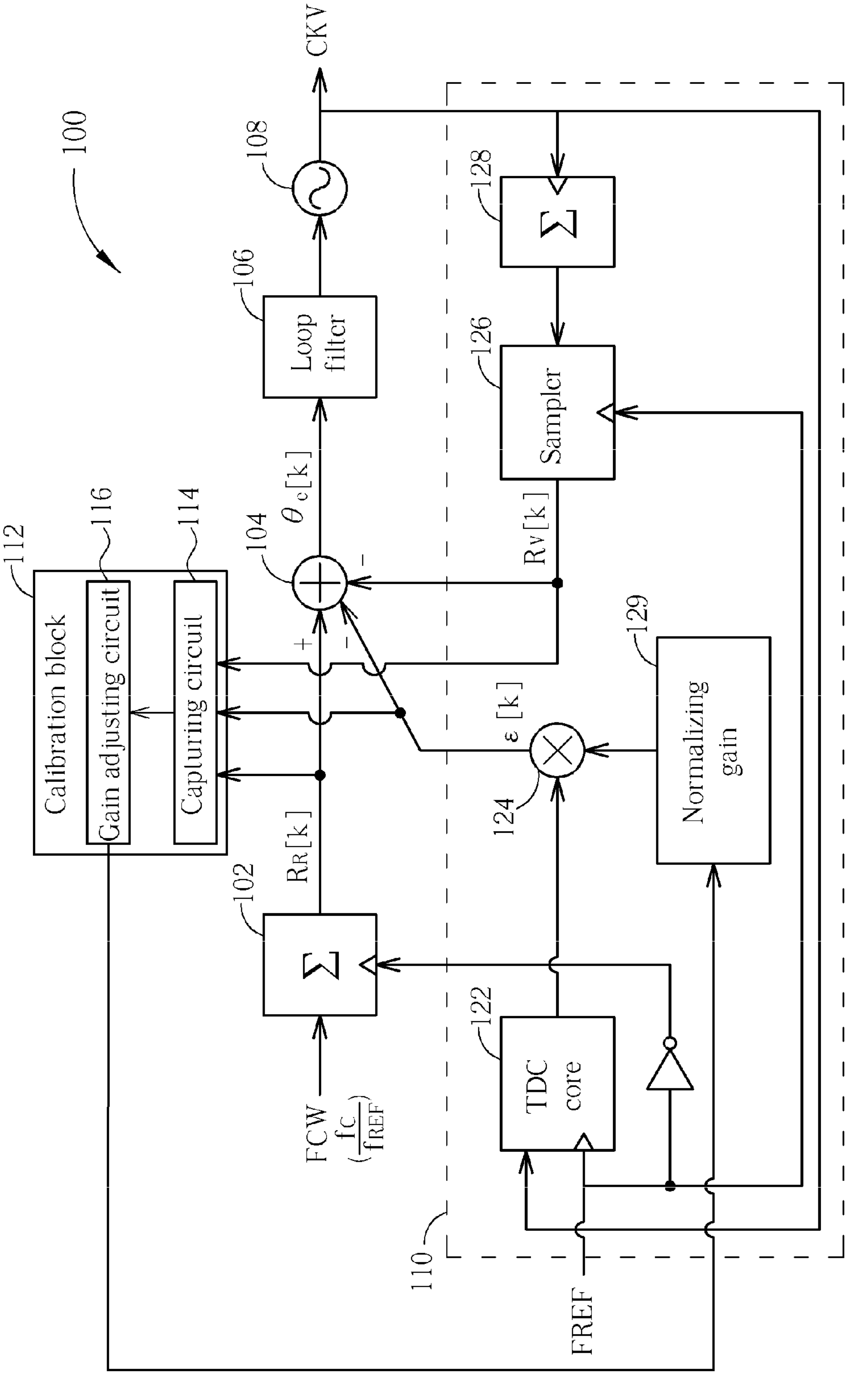
FIG. 1 is a diagram illustrating an ADPLL according to a first exemplary embodiment of the present invention.

FIG. 1 is a diagram illustrating an ADPLL according to a first exemplary embodiment of the present invention. The exemplary ADPLL 100 includes an accumulator 102, an adder (performing a subtraction operation) 104, a loop filter 106, a digitally-controlled oscillator (DCO) 108, a TDC 110, and a calibration block 112, where the TDC 110 includes a TDC core 122, a multiplier 124, a sampler 126, and an accumulator 128, and the calibration block 112 includes a capturing circuit 114 and a gain adjusting circuit 116. It should be noted that only the elements pertinent to the present invention are shown in FIG. 1. The ADPLL 100 may have additional elements included therein, depending upon actual design requirement/consideration. The accumulator 102 is clocked by a frequency reference clock FREF with a fixed frequency $f_{REF}$ (e.g., 26 MHz), and arranged for accumulating a frequency command word FCW according to the frequency reference clock FREF. As shown in FIG. 1, the accumulator 102 is clocked by falling edges of the frequency reference clock FREF, and the frequency command word FCW is set by $f_c/f_{REF}$, where $f_c$ is a nominal carrier frequency of the output clock CKV of the DCO 108. Therefore, the reference phase $R_R$ is increased by an increment value $f_c/f_{REF}$ each time the accumulator 102 is clocked by one falling edge of the frequency reference clock FREF. The TDC 110 is arranged for generating a TDC output sample (i.e., a normalized TDC output code) $\epsilon$ and a variable phase $R_V$. Specifically, the accumulator 128 is clocked by the output clock CKV for counting clock cycles of the output clock CKV and accordingly generates an accumulated result. In this embodiment, the sampler 126 is clocked by rising edges of the frequency reference clock FREF. Therefore, the sampler 126 samples the accumulated result generated by the accumulator 128 and outputs one sampled value as the variable phase $R_V$ each time the sampler 126 is clocked by one rising edge of the frequency reference clock FREF. The TDC core 122 generates a TDC output code according to the output clock CKV and the frequency reference clock FREF. For example, the TDC core 122 may be implemented using an inverter delay chain which includes a plurality of cascaded inverters acting as TDC cells. The multiplier 124 is arranged to multiply the TDC output code with the TDC normalizing gain 129 and accordingly generate the normalized TDC output code $\epsilon$. The TDC normalizing gain 129 needs to be an inverse of the TDC step size or TDC gain, which is a physical parameter of the TDC in units of ps, multiplied by a constant such that the multiplier 124 output is a fixed point number between 0.0 and 1.0 for the full range (i.e., 0-$T_V$) of the TDC input. Hence, since the TDC gain and the optimal value of the TDC normalizing gain 129 are the mathematical inverse of each other, these terms are used interchangeably: knowing the TDC gain gives the mathematically precise value of the multiplier 129, and having an estimate of the normalizing gain (multiplier 129) allows to also estimate the TDC gain. From the operational viewpoint the normalizing the TDC gain is as follows: Initially, the TDC gain is not known since it is the subject of the process, voltage and temperature variations. Hence, an estimate is used as a starting point of the calibration process. The calibration process can estimate the TDC step size and then calculate its inverse to arrive at the TDC normalizing gain. Alternatively, the calibration process can iteratively arrive at the most optimal value of the TDC normalizing gain multiplier, in which case knowledge of its inverse, i.e., the TDC gain might not be required. The loop filter 106 generates a digital control value to the DCO 108 according to a phase error $\theta_e$ generated from the adder 104. For example, the phase error $\theta_e$ with the discrete-time index k may be expressed as below.

$$\Theta_e[k]=R_R[k]-R_V[k]-\epsilon[k] \quad (1)$$

As the present invention focuses on calibrating the TDC normalizing gain 129, details of the TDC 110 are omitted here for brevity. It should be noted that the TDC implementation shown in FIG. 1 is for illustrative purposes only, and is not meant to be a limitation of the present invention. For example, a retiming mechanism may be employed to generate a retimed frequency reference clock by using rising edges of the output clock CKV to sample the frequency reference clock FREF. Hence, the retimed frequency reference clock is used to take place of the frequency reference clock FREF received by the sampler 126 and the accumulator 102. Details of the traditional ADPLL can be found in a book: R. B. Staszewski and P. T. Balsara, "All-Digital Frequency Synthesizer in Deep-Submicron CMOS", New Jersey: John Wiley & Sons, Inc., 261 pages, ISBN: 978-0471772552, September 2006.

The capturing circuit 114 of the calibration block 112 is arranged for capturing the reference phase $R_R$, the TDC output sample $\epsilon$ and the variable phase $R_V$, and the gain adjusting circuit 116 of the calibration block 112 is arranged for adjusting the TDC normalizing gain 129 in response to the captured reference phase $R_R$, TDC output sample $\epsilon$ and variable phase $R_V$. Specifically, the gain adjusting circuit 116 of the calibration block 112 derives a gradient from calculating a difference between a slope of the TDC output sample, such as slope($\epsilon$[k]$-\epsilon$[k$-$1]), and a slope of a difference between the reference phase and the variable phase, such as slope(($R_R$[k]$-R_V$[k])$-$($R_R$[k$-$1]$-R_v$[k$-$1])), and continuously/iteratively updates the TDC normalizing gain 129 based on the calculated gradient. As the gradient is taken as an error function, the calibration block 112 will stochastically reduce the error of the TDC normalizing gain 129.

Figure 2:
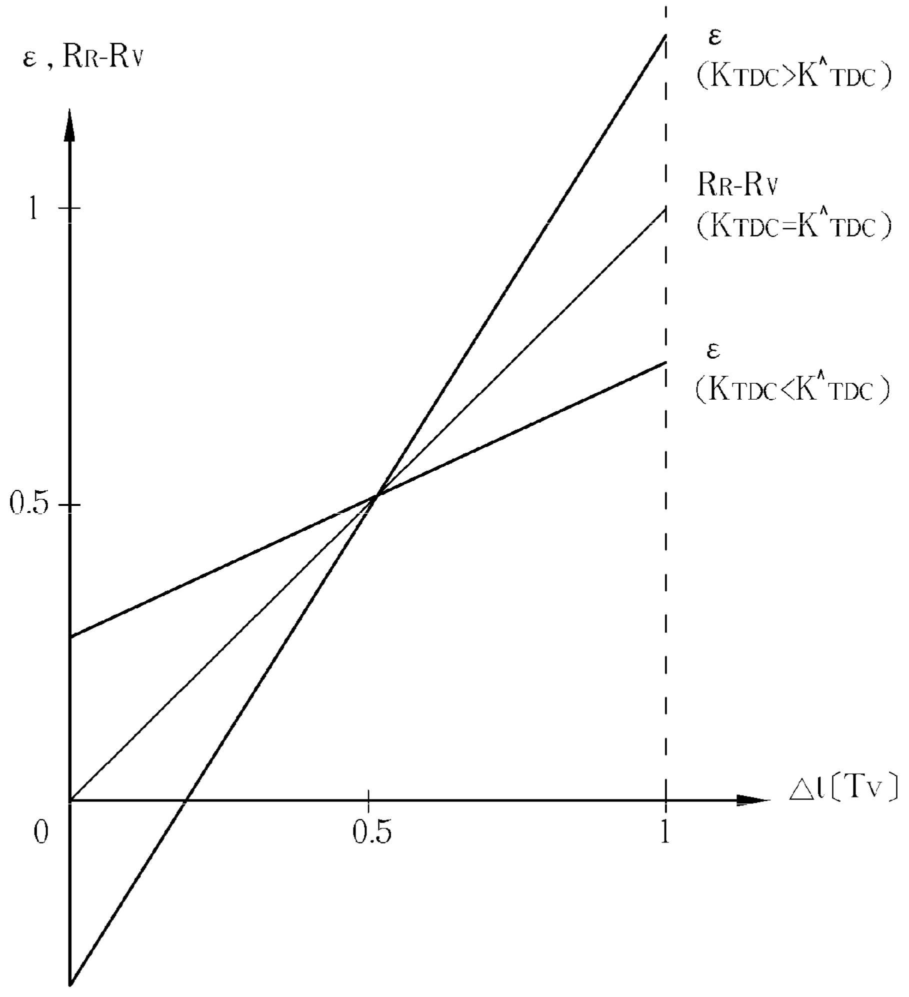
FIG. 2 is a diagram illustrating the effect of the TDC normalizing gain error.

Please refer to FIG. 2, which is a diagram illustrating the effect of the TDC normalizing gain error. It plots two components ($\epsilon$ and $R_R-R_V$) of the digital phase error versus the input time difference in the units of the nominal DCO period ($T_V$). The plot also accounts for zeroing out of the phase error, which is the expected long-term operation of the type-II ADPLL-loop. As mentioned above, the TDC normalizing gain 129 is used to normalize the TDC output code generated from the TDC core 122. Hence, the TDC normalizing gain 129 changes the slope of the TDC output sample $\epsilon$. The output clock CKV may have frequency variation due to TDC normalizing gain error. However, as the sampling rate of the sampler 126 is lower than the clock rate of the output clock CKV, the variation of the variable phase $R_V$ may be mitigated/avoided due to accumulation performed by the accumulator 128. As mentioned above, the DCO 108 adjusts the output clock CKV in response to the phase error $\theta_e$ (e.g., $\theta_e=R_R-R_V-\epsilon$). Assuming the ADPLL loop is settled and operates in type-II, the slope of the TDC output sample $\epsilon$ should match the slope of the $R_R-R_V$ value when the TDC normalizing gain 129 is set by a value $K_{TDC}$ equal to a correct value (i.e., an ideal value) $K_{TDC,0}$. In a case where the slope of the TDC output sample $\epsilon$ is found larger than the slope of the $R_R-R_V$ value, this implies that the TDC normalizing gain 129 is set by a value $K_{TDC}$ larger than the correct value $K_{TDC,0}$. In another case where the slope of the TDC output sample $\epsilon$ is found smaller than the slope of the $R_R-R_V$ value, this implies that the TDC normalizing gain 129 is set by a value $K_{TDC}$ smaller than the correct value $K_{TDC,0}$. To put it another way, there is a positive correlation between the TDC normalizing gain error and the fractional number of the $R_R-R_V$ value, and the slope of the $R_R$-$R_V$ value is related to the fractional number of the $R_R-R_V$ value.

By monitoring the gradient derived from slope($\epsilon$)$-$slope($R_R-R_V$), the calibration block 112 easily knows how to adjust the TDC normalizing gain 129. For example, the calibration block 112 subtracts an adjustment step value from the current gain value $K_{TDC}$ for decreasing the TDC normalizing gain 129 when the gradient has a positive sign, and adds an adjustment step value to the current gain value $K_{TDC}$ for increasing the TDC normalizing gain 129 when the gradient has a negative sign.

Regarding the above-mentioned example, the calibration block 112 utilizes captured TDC output sample $\epsilon$, captured reference phase $R_R$ and captured variable phase $R_V$ to estimate the gradient which is referenced to control the TDC gain calibration. In an alternative design of the present invention, the reference phase and the variable phase may be set by expected values directly. In other words, the aforementioned slope($R_R-R_V$) may be regarded as a predetermined value since the difference between the expected reference phase and the expected variable phase is known beforehand.

Figure 3:
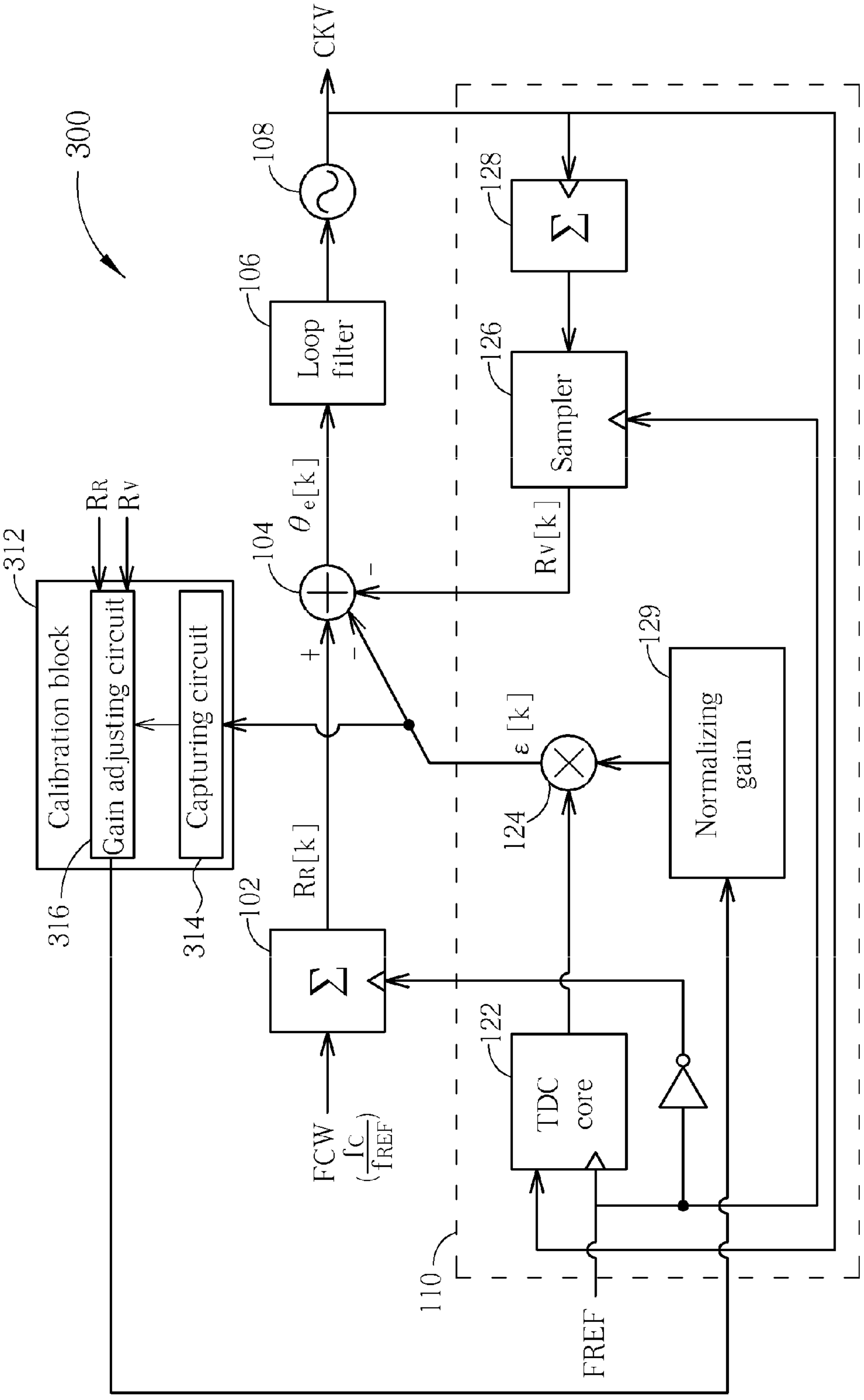
FIG. 3 is a diagram illustrating an ADPLL according to a second exemplary embodiment of the present invention.

Please refer to FIG. 3, which is a diagram illustrating an ADPLL according to a second exemplary embodiment of the present invention. The calibration block 312 of the ADPLL 300 captures the TDC output sample $\epsilon$ generated from the TDC 110, and utilizes the captured TDC output sample $\epsilon$ as well as expected values $R_R$, $R_V$ of the reference phase and the variable phase for obtaining the gradient. As can be readily known from the following equation (2), the gradient may be calculated by slope($\epsilon$)−slope($R_R-R_V$), where slope($R_R-R_V$) is a predetermined (calculated) dynamically-changing value, and slope($\epsilon$) is dynamically calculated in response to the captured TDC output samples. The same objective of stochastically reducing the TDC normalizing gain error by iteratively adjusting the TDC normalizing gain 129 based on the calculated gradient is achieved. Various iterative methods well known in the field of adaptive signal processing, such as least mean square (LMS) algorithms, may be used. By way of example, a sign-sign LMS algorithm may be used by the gain adjusting circuit 116/316 of the calibration block 112/312.

As mentioned above, the phase error $\theta_e$ is equal to $R_R-R_V-\epsilon$. Hence, the gradient, which is the difference between successive phase error samples (e.g., $\theta_e[k]$ and $\theta_e[k-1]$) may be obtained using following equation.

$$\begin{aligned}\theta_e[k]-\theta_e[k-1] &= (R_R[k]-R_V[k]-\varepsilon[k])-(R_R[k-1]-R_V[k-1]-\varepsilon[k-1]) \\ &= [(R_R[k]-R_V[k])-(R_R[k-1]-R_V[k-1])]-(\varepsilon[k]-\varepsilon[k-1])\end{aligned} \quad (2)$$

Figure 4:
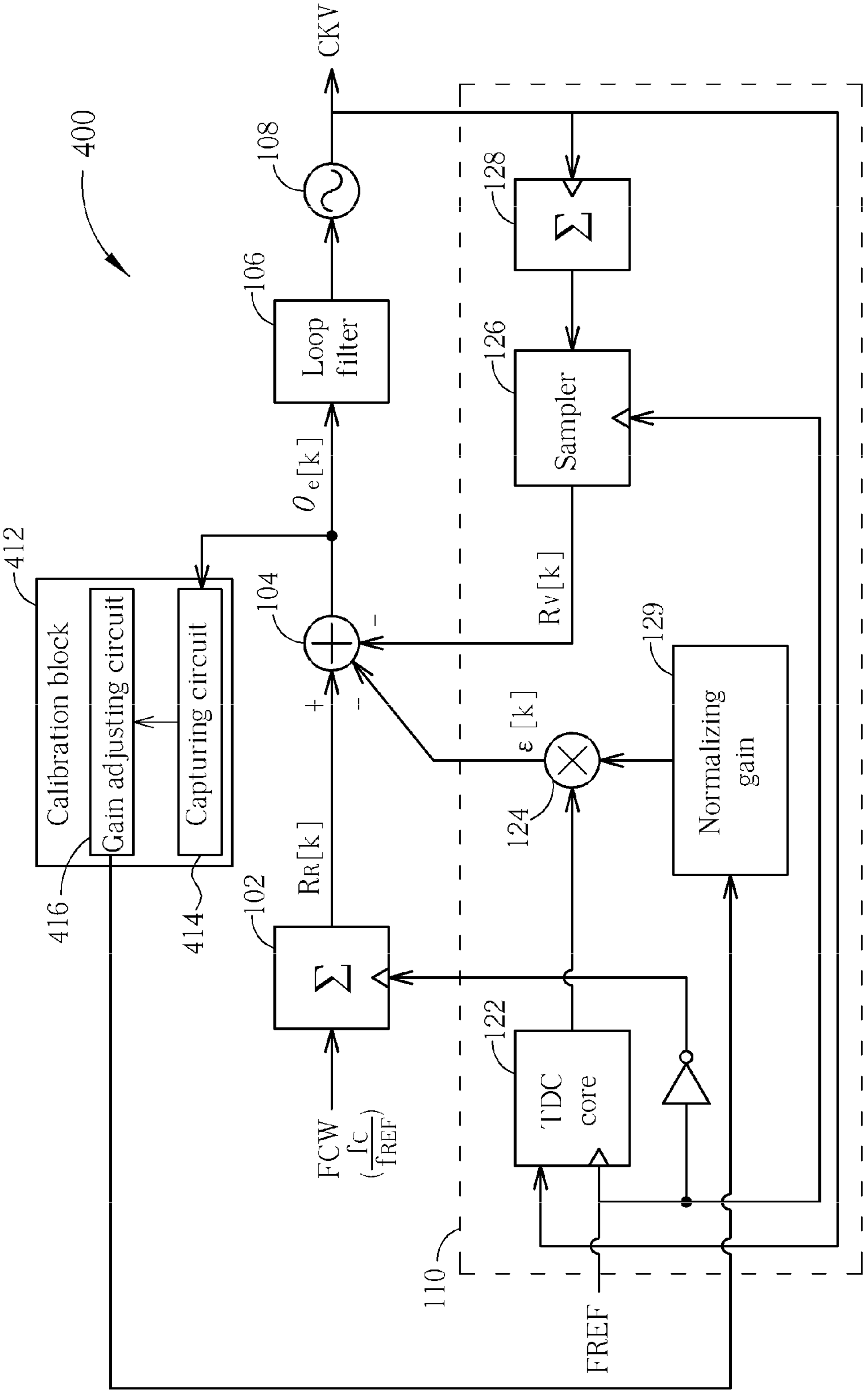
FIG. 4 is a diagram illustrating an ADPLL according to a third exemplary embodiment of the present invention.

Therefore, the phase error $\theta_e$ also gives information correlated with the TDC normalizing gain error, and may be used for controlling the TDC gain calibration. Please refer to FIG. 4, which is a diagram illustrating an ADPLL according to a third exemplary embodiment of the present invention. A capturing circuit 414 of the calibration block 412 of the ADPLL 400 captures the phase error $\theta_e$, and a gain adjusting circuit 416 of the calibration block 412 calculates a gradient in response to the captured phase error $\theta_e$. When the gradient has a positive sign, this implies that the slope of the TDC output sample $\epsilon$ is smaller than the slope of the $R_R-R_V$ value, and the TDC normalizing gain 129 has a value $K_{TDC}$ smaller than the correct value $K_{TDC,0}$. Therefore, the gain adjusting circuit 416 of the calibration block 412 adds an adjustment step value to the current gain value $K_{TDC}$ for increasing the TDC normalizing gain 129. When the gradient value has a negative sign, this implies that the slope of the TDC output sample $\epsilon$ is larger than the slope of the $R_R-R_V$ value, and the TDC normalizing gain 129 has a value $K_{TDC}$ larger than the correct value $K_{TDC,0}$. Therefore, the gain adjusting circuit 416 of the calibration block 412 subtracts an adjustment step value from the current gain value $K_{TDC}$ for decreasing the TDC normalizing gain 129. The same objective of stochastically reducing the TDC normalizing gain error by iteratively adjusting the TDC normalizing gain 129 based on the calculated gradient is achieved. Naturally, the stochastic iterative method could also be sign-value or sign-sign, which is well known in the field of adaptive signal processing. Various iterative methods well known in the field of adaptive signal processing, such as least mean square (LMS) algorithms, may be used. By way of example, a sign-sign LMS algorithm may be used by the gain adjusting circuit 416 of the calibration block 412.

Figure 5:
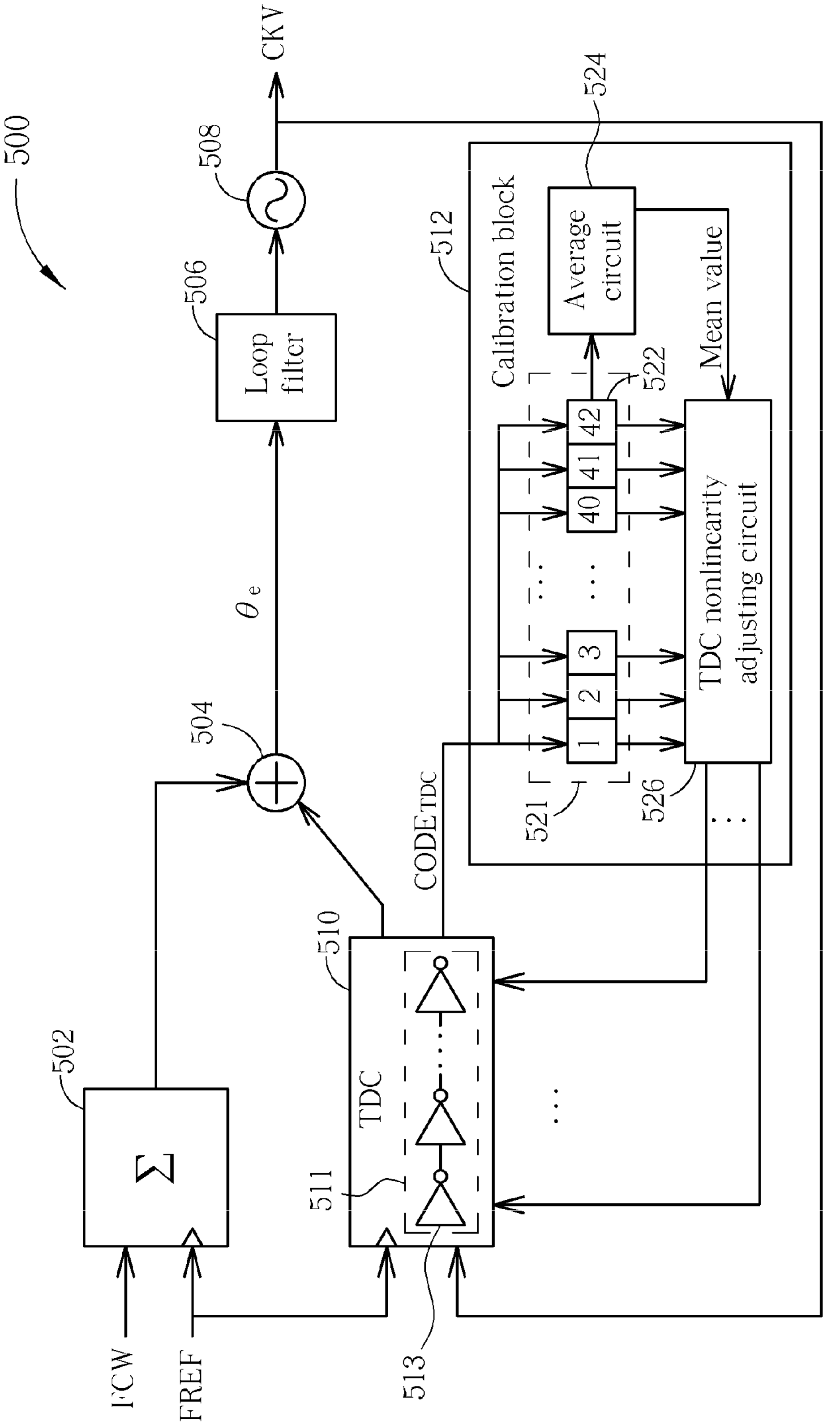
FIG. 5 is a diagram illustrating an ADPLL according to a fourth exemplary embodiment of the present invention.
Figure 6:
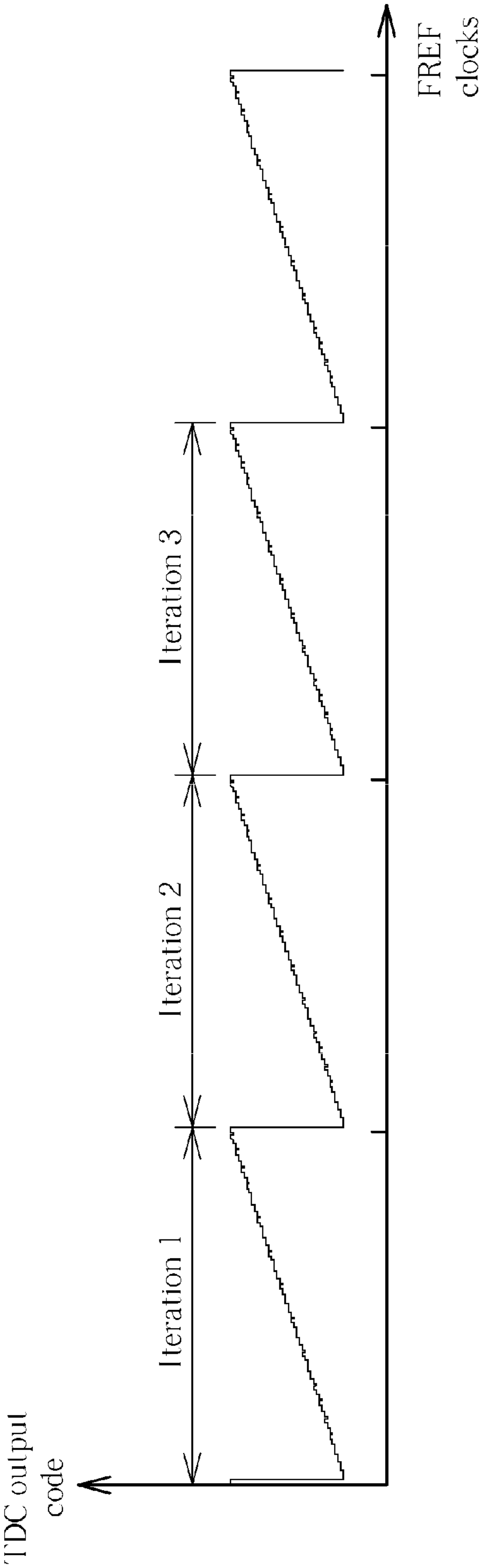
FIG. 6 is a diagram illustrating the relation between the clock cycles of the frequency reference clock and the value of the TDC output code.

The linearity performance of the TDC may also affect the quality of the ADPLL. Hence, the TDC cell mismatch is also needed to be well accounted for to avoid the degradation of the ADPLL performance. The present invention further proposes a TDC nonlinearity calibration scheme. Please refer to FIG. 5, which is a diagram illustrating an ADPLL according to a fourth exemplary embodiment of the present invention. The exemplary ADPLL 500 includes an accumulator 502, an adder 504, a loop filter 506, a DCO 508, a TDC 510, and a calibration block 512. It should be noted that only the elements pertinent to the present invention are shown in FIG. 5. The ADPLL 500 may have additional elements included therein, depending upon actual design requirement/consideration. The accumulator 502 is clocked by a frequency reference clock FREF with a fixed frequency $f_{REF}$ (e.g., 26 MHz), and arranged for accumulating a frequency command word FCW set by $f_c/f_{REF}$, where $f_c$ is a nominal carrier frequency of the output clock CKV of the DCO 508, and the frequency command word FCW is a fixed value composed of an integer number and a fractional number (e.g., 1/1000 or 1/10000). Therefore, an accumulator output is increased by the fixed value representative of $f_c/f_{REF}$ each time the accumulator 502 is clocked by the frequency reference clock FREF. The TDC 510 is arranged for generating a TDC output (e.g., a normalized TDC code) to the adder 504, where the TDC 510 has a TDC core 511 including a plurality of TDC cells (e.g., inverters) 513 cascaded in series, and the TDC core 511 generates a TDC output code $CODE_{TDC}$. Based on setting of the fractional number of the frequency command word FCW, the digital value of the TDC output code $CODE_{TDC}$ is expected to increase from a minimum value to a maximum value gradually, and could be clipped at the maximum value when an overflow occurs. FIG. 6 is a diagram illustrating the relation between clock cycles of the frequency reference clock FREF and the digital value of the TDC output code $CODE_{TDC}$. Assuming that the fractional number of the frequency command word FCW is set to a small value of 1/1000, one TDC output code $CODE_{TDC}$ is generated for a number of FREF clock cycles, and the TDC output code $CODE_{TDC}$ is gradually increased from a minimum value to a maximum value with 1000 clock cycles of the frequency reference clock FREF.

The loop filter 506 generates a digital control value to the DCO 508 according to a phase error $\theta_e$ generated from outputs of the accumulator 502 and the normalized TDC 510. The cell delay of one TDC cell 513 may be different from the cell delay of another TDC cell 513. Such a mismatch can be systematic (due to layout/geometry) and/or random (impurity doping fluctuation, edge roughness), thus resulting in TDC nonlinearity. The TDC cell mismatch would degrade accuracy of the TDC output code $CODE_{TDC}$. Therefore, the calibration block 512 is employed for performing TDC nonlinearity calibration by accounting for the cell delay of each TDC cell 513 implemented in the TDC 510. Such accounting for can be realized as a small additive or multiplicative adjustment in calculating ϵ at the TDC unit granularity. By way of example, but not limitation, the TDC 510 in this embodiment may be configured to have 42 TDC cells 513. The calibration block 512 captures each TDC output code sample (i.e., a TDC value carried by the TDC output code $CODE_{TDC}$), and uses 42 multi-bit registers 522 to record accumulation values respectively, where each accumulation value indicates the number of times a specific sampled TDC value is carried by the TDC output code $CODE_{TDC}$. For example, the register 522 indexed by "1" is used to record the number of times the TDC output code sample has the TDC value equal to 1, the register indexed by "2" is used to record the number of times the TDC output code sample has the TDC value equal to 2, and so on. The accumulation value is indicative of the cell delay length of the corresponding TDC cell. This is straightforward in case the TDC input is linearly swept with constant slope; it can be also understood stochastically when the TDC input is random with flat statistical distribution. The calibration block 512 includes a calculating circuit, such as an average circuit 524 for calculating a mean value of the accumulation values stored in the registers 522. If each of the accumulation values is equal to the same mean value after cell delays of the TDC cells 513 are properly calibrated, this implies that each of the TDC cells has the same cell delay and the mismatch between TDC cells is eliminated.

As shown in FIG. 5, the calibration block 512 further includes a TDC nonlinearity adjusting circuit 526 arranged to adjust/account for a cell delay of a TDC cell by referring to the mean value and a corresponding accumulation value. For example, the difference between the mean value and the accumulation value stored in the register 522 indexed by "1" is used by the TDC nonlinearity adjusting circuit 526 to adjust/account for a cell delay of a leading TDC cell (i.e., $1^{st}$ TDC cell) included in the inverter delay chain. It should be noted that the closed loop would try to compensate the mismatch error of one bit (i.e., one TDC cell) using next bits (i.e., next TDC cells), and the mismatch error will propagate to next several bits. Therefore, the cascaded TDC cells 513 of the inverter delay chain should be sequentially calibrated from the leading TDC cell (i.e., the left-most TDC cell 513 shown in FIG. 5) to the last TDC cell (i.e., the right-most TDC cell 513 shown in FIG. 5). Hence, at the end of the first iteration shown in FIG. 6, the registers 522 store accumulation values respectively, the mean value can be obtained by the average circuit 524, and the TDC nonlinearity adjusting circuit 526 is operative to adjust a cell delay of the leading TDC cell 513 to make the accumulation value recorded in the register 522 indexed by "1" approach the mean value, thus reducing or eliminating the mismatch error propagated to the next TDC cell in the next iteration (i.e., the second iteration). At the end of the second iteration shown in FIG. 6, the registers 522 store accumulation values respectively, and the TDC nonlinearity adjusting circuit 526 is operative to adjust a cell delay of the next TDC cell 513 cascaded to the leading TDC cell 513 to make the accumulation value recorded in the register 522 indexed by "2" approach the same mean value, thus reducing or eliminating the mismatch error propagated to the next TDC cell in the next iteration (i.e., the third iteration). As a person skilled in the pertinent art can readily understand the cell delay adjusting operation applied to following TDC cells included in the inverter delay chain, further description is omitted here for brevity. The above-mentioned TDC mismatch calibration may be repeated by re-calculating a mean value after all of the TDC cells 513 have been calibrated. In this way, the calibration block 512 is capable of reducing the TDC mismatch stochastically.

Regarding the calibration block 512 shown in FIG. 5, it is capable of adjusting correction gain of the normalized TDC 510. In one exemplary design, adjusting the correction gain of the normalized TDC 510 may be accomplished through applying additive adjustment to a normalized TDC output. In another exemplary design, adjusting the correction gain of the normalized TDC 510 may be accomplished through adjusting a cell delay of a TDC cell. For example, the TDC has a plurality of TDC cells cascaded in series, and the TDC nonlinearity adjusting circuit 526 may be configured to adjust a cell delay of a first TDC cell prior to adjusting a cell delay of a second TDC cell following the first TDC cell, or adjust a normalized TDC output of the first TDC cell prior to adjusting a normalized TDC output of the second TDC cell following the first TDC cell.

Figure 7:
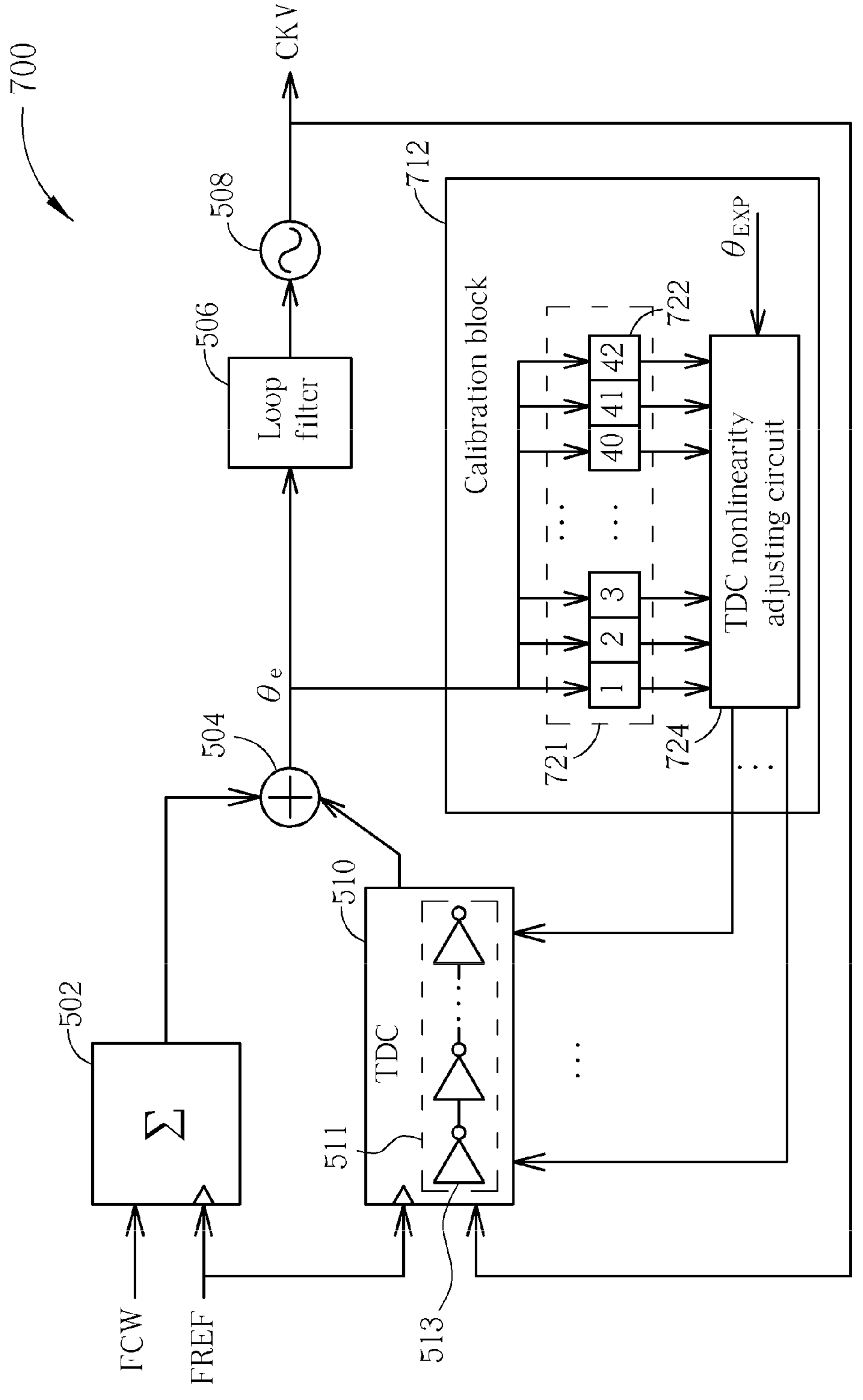
FIG. 7 is a diagram illustrating an ADPLL according to a fifth exemplary embodiment of the present invention.

Please refer to FIG. 7, which is a diagram illustrating an ADPLL according to a fifth exemplary embodiment of the present invention. The major difference between ADPLL 600 and ADPLL 700 is that the calibration block 712 of the ADPLL 700 is arranged to capture the phase error samples. Hence, the calibration block 712 uses 42 registers 722 to record phase error samples each corresponding to one of the TDC cells 513. For example, the register 722 indexed by "1" is used to record a phase error sample which is captured when the current TDC output code has the TDC value equal to 1, the register 722 indexed by "2" is used to record a phase error sample which is captured when the current TDC output code has the TDC value equal to 2, and so on. The phase error sample is indicative of the cell delay length of the corresponding TDC cell. As shown in FIG. 7, the calibration block 712 further includes a TDC nonlinearity adjusting circuit 724 arranged to adjust a cell delay of a TDC cell by referring to difference between the captured phase error samples and an expected value $\theta_{EXP}$ of the captured phase error samples. In this embodiment, the expected value $\theta_{EXP}$ is based according to an unadjusted output of the TDC 510. For example, the expected value $\theta_{EXP}$ is set under the condition where the TDC normalizing gain error and cell delay mismatch of the TDC 510 are not compensated yet. Thus, the expected value $\theta_{EXP}$ includes the expected phase error resulting from the TDC normalizing gain error. In other words, the expected value $\theta_{EXP}$ is not equal to zero.

If each of the captured phase error samples is equal to the same expected value $\theta_{EXP}$ after the cell delays of the TDC cells 513 are calibrated, this implies that each of the TDC cells 513 has the same cell delay and the mismatch between TDC cells is eliminated or non-existent. Therefore, the difference between the expected value $\theta_{EXP}$ and the phase error sample stored in the register 722 indexed by "1" is used by the TDC nonlinearity adjusting circuit 724 to adjust a cell delay of a leading TDC cell (i.e., $1^{st}$ TDC cell) included in the inverter delay chain. Similarly, as the closed loop would try to compensate the mismatch error of one bit (i.e., one TDC cell) using next bits (i.e., next TDC cells) and the mismatch error will propagate to next several bits, the cascaded TDC cells 513 of the inverter delay chain should be sequentially calibrated from the leading TDC cell (i.e., the left-most TDC cell 513 shown in FIG. 7) to the last TDC cell (i.e., the right-most TDC cell 513 shown in FIG. 7). Hence, when the captured phase error sample corresponds to the leading TDC cell (i.e., the left-most TDC cell 513 shown in FIG. 7), the TDC nonlinearity adjusting circuit 724 would adjust the cell delay of the leading TDC cell to make the captured phase error approach the expected value $\theta_{EXP}$, thus reducing or eliminating the mismatch error propagated to the next TDC cell in the same iteration (e.g., the first iteration shown in FIG. 6); and when the phase error sample corresponds to the next TDC cell following the leading TDC cell is captured, the TDC nonlinearity adjusting circuit 724 would adjust the cell delay of the next TDC cell following the leading TDC cell to make the captured phase error approach the same expected value $\theta_{EXP}$, thus reducing or eliminating the mismatch error propagated to the next TDC cell in the same iteration (e.g., the first iteration shown in FIG. 6). As a person skilled in the pertinent art can readily understand the cell delay adjusting operation applied to the following TDC cells, further description is omitted here for brevity. The TDC nonlinearity adjusting circuit 724 may adjust the cell delays of all TDC cells 513 during one iteration shown in FIG. 6, and adjust the cell delays of all TDC cells 513 again during another iteration shown in FIG. 6. In this way, the calibration block 712 is capable of reducing the TDC mismatch stochastically.

Figure 8:
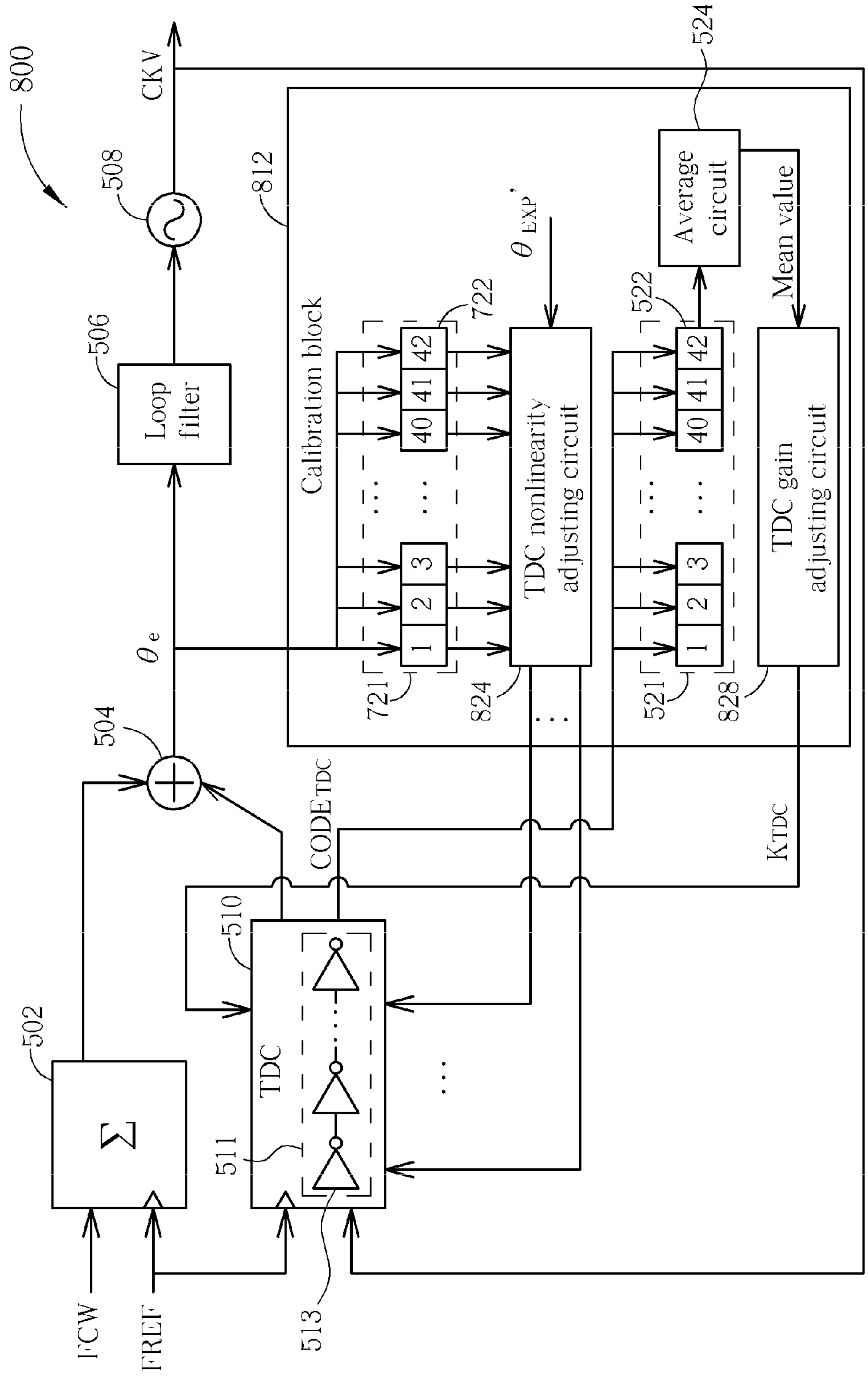
FIG. 8 is a diagram illustrating an ADPLL according to a sixth exemplary embodiment of the present invention.

In the example shown in FIG. 7, the expected value $\theta_{EXP}$ is based according to an unadjusted output of the TDC 510. Alternatively, the expected value may be based according to an adjusted output of the TDC 510. For example, an expected value $\theta_{EXP}'$ is set under the condition where the TDC normalizing gain error of the TDC 510 has been compensated. Thus, when the expected value $\theta_{EXP}'$ is properly set, the resulting expected value $\theta_{EXP}'$ does not include the expected phase error resulting from the TDC normalizing gain error. Please refer to FIG. 8, which is a diagram illustrating an ADPLL according to a sixth exemplary embodiment of the present invention. The calibration block 812 of the ADPLL 800 includes a TDC nonlinearity adjusting circuit 824, a TDC gain adjusting circuit 828, and the aforementioned registers 722, 522 and average circuit 524. In this embodiment, the mean value generated from the average circuit 524 is used by the TDC gain adjusting circuit 828 for setting the normalizing gain $K_{TDC}$ of the TDC 510. Therefore, the expected value $\theta_{EXP}'$ may be set without considering the expected phase error resulting from the TDC normalizing gain error. For example, the expected value $\theta_{EXP}'$ may be set by zero. The TDC nonlinearity adjusting circuit 824 is arranged to adjust a cell delay of a TDC cell by referring to difference between the captured phase error samples stored in the registers 722 and the expected value $\theta_{EXP}'$ of the captured phase error samples. As the function of the TDC nonlinearity adjusting circuit 824 is the same as that of the TDC nonlinearity adjusting circuit 724, further description is omitted here for brevity. The same objective of reducing the TDC mismatch stochastically is achieved by using the calibration block 812.

In above examples, the calibration block 712/812 is capable of adjusting correction gain of the normalized TDC 510. In one exemplary design, adjusting the correction gain of the normalized TDC 510 may be accomplished through adjusting a TDC normalizing gain. In another exemplary design, adjusting the correction gain of the normalized TDC 510 may be accomplished through applying additive adjustment to a normalized TDC output. In yet another exemplary design, adjusting the correction gain of the normalized TDC 510 may be accomplished through adjusting a cell delay of a TDC cell. For example, the TDC has a plurality of TDC cells cascaded in series, and the TDC nonlinearity adjusting circuit 724/824 may be configured to adjust a cell delay of a first TDC cell prior to adjusting a cell delay of a second TDC cell following the first TDC cell, or adjust a normalized TDC output of the first TDC cell prior to adjusting a normalized TDC output of the second TDC cell following the first TDC cell.

The present invention proposes using the existing ADPLL circuitry to do the TDC nonlinearity and gain calibration. In other words, part of the existing ADPLL circuitry is reused by the TDC nonlinearity and gain calibration, which saves area and power. Specifically, all the error information is captured from part of the digital blocks, all non-ideal effects are fixed in the digital domain, and the calibration is very fast and can be operated on-line or at the beginning of every burst. Compared to the conventional design, the proposed calibration mechanism of the present invention does not exhibit phase error hits before each RX/TX packet due to employed iterative operations with small step sizes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of estimating mismatches of a time-to-digital converter (TDC) comprising:
- capturing phase error samples;
- calculating difference between said phase error samples and an expected value of said phase error samples; and
- adjusting correction gain of said TDC based on said calculating step.

2. The method of claim 1, wherein adjusting said correction gain of said TDC is accomplished through adjusting a TDC normalizing gain.

3. The method of claim 1, wherein adjusting said correction gain of said TDC is accomplished through applying additive adjustment to a normalized TDC output.

4. The method of claim 1, wherein said adjusting step stochastically reduces said TDC mismatch.

5. The method of claim 1, wherein said expected value is based according to an unadjusted output of said TDC.

6. The method of claim 1, further comprising:
- capturing TDC output code samples of an unadjusted output of said TDC; and
- adjusting a TDC normalizing gain based on said TDC output code samples, wherein said expected value is based according to an adjusted output of said TDC.

7. The method of claim 1, wherein said TDC comprises a plurality of TDC cells cascaded in series, and said adjusting step adjusts a cell delay of a first TDC cell prior to adjusting a cell delay of a second TDC cell following the first TDC cell.

8. The method of claim 1, wherein said TDC comprises a plurality of TDC cells cascaded in series, and said adjusting step adjusts a normalized TDC output of the first TDC cell prior to adjusting a normalized TDC output of a second TDC cell following the first TDC cell.

9. The method of claim 1, wherein said TDC is part of an all-digital phase-locked loop (ADPLL).

10. A method of estimating mismatches of a time-to-digital converter (TDC) comprising:
- capturing TDC output code samples;
- storing a plurality of accumulation values corresponding to different TDC values respectively, wherein each accumulation value records a number of times a TDC value is carried by said TDC output code samples;
- calculating a desired value based on said accumulation values;
- calculating difference between said accumulation values and said desired value; and
- adjusting correction gain of said TDC based on said calculating step.

11. The method of claim 10, wherein adjusting said correction gain of said TDC is accomplished through applying additive adjustment to a normalized TDC output.

12. The method of claim 10, wherein said adjusting step stochastically reduces said TDC mismatch.

13. The method of claim 10, wherein said desired value is a mean value of said accumulation values.

14. The method of claim 10, wherein said TDC comprises a plurality of TDC cells cascaded in series, and said adjusting step adjusts a cell delay of a first TDC cell prior to adjusting a cell delay of a second TDC cell following the first TDC cell.

15. The method of claim 10, wherein said TDC comprises a plurality of TDC cells cascaded in series, and said adjusting step adjusts a normalized TDC output of the first TDC cell prior to adjusting a normalized TDC output of a second TDC cell following the first TDC cell.

16. The method of claim 10, wherein said TDC is part of an all-digital phase-locked loop (ADPLL).

17. An apparatus of estimating mismatches of a time-to-digital converter (TDC) comprising:

a first capturing circuit, arranged for capturing phase error samples; and a first adjusting circuit, arranged for calculating difference between said phase error samples and an expected value of said phase error samples, and adjusting correction gain of said TDC based on said difference.

18. The apparatus of claim 17, wherein said first adjusting circuit adjusts said correction gain of said TDC through adjusting a TDC normalizing gain.

19. The apparatus of claim 17, wherein said first adjusting circuit adjusts said correction gain of said TDC through applying additive adjustment to a normalized TDC output.

20. The apparatus of claim 17, wherein said first adjusting circuit stochastically reduces said TDC mismatch.

21. The apparatus of claim 17, wherein said expected value is based according to an unadjusted output of said TDC.

22. The apparatus of claim 17, further comprising:

a second capturing circuit, arranged for capturing TDC output code samples of an unadjusted output of said TDC; and a second adjusting circuit, arranged for adjusting a TDC normalizing gain based on said TDC output code samples, wherein said expected value is based according to an adjusted output of said TDC.

23. The apparatus of claim 17, wherein said TDC comprises a plurality of TDC cells cascaded in series, and said first adjusting circuit adjusts a cell delay of a first TDC cell prior to adjusting a cell delay of a second TDC cell following the first TDC cell.

24. The apparatus of claim 17, wherein said TDC comprises a plurality of TDC cells cascaded in series, and said first adjusting circuit adjusts a normalized TDC output of the first TDC cell prior to adjusting a normalized TDC output of a second TDC cell following the first TDC cell.

25. The apparatus of claim 17, wherein said TDC is part of an all-digital phase-locked loop (ADPLL).

26. An apparatus of estimating mismatches of a time-to-digital converter (TDC) comprising:

a capturing circuit, arranged for capturing TDC output code samples, and storing a plurality of accumulation values corresponding to different TDC values respectively, wherein each accumulation value records a number of times a TDC value is carried by said TDC output code samples;

a calculating circuit, arranged for calculating a desired value based on said accumulation values; and an adjusting circuit, arranged for calculating difference between said accumulation values and said desired value, and adjusting correction gain of said TDC based on said difference.

27. The apparatus of claim 26, wherein said adjusting circuit adjusts said correction gain of said TDC through applying additive adjustment to a normalized TDC output.

28. The apparatus of claim 26, wherein said adjusting circuit stochastically reduces said TDC mismatch.

29. The apparatus of claim 26, wherein said calculating circuit is an average circuit, and said desired value is a mean value of said accumulation values.

30. The apparatus of claim 26, wherein said TDC comprises a plurality of TDC cells cascaded in series, and said adjusting circuit adjusts a cell delay of a first TDC cell prior to adjusting a cell delay of a second TDC cell following the first TDC cell.

31. The apparatus of claim 26, wherein said TDC comprises a plurality of TDC cells cascaded in series, and said adjusting circuit adjusts a normalized TDC output of the first TDC cell prior to adjusting a normalized TDC output of a second TDC cell following the first TDC cell.

32. The apparatus of claim 26, wherein said TDC is part of an all-digital phase-locked loop (ADPLL).

* * * * *